United States Patent

Plettner et al.

[11] Patent Number: 5,985,739
[45] Date of Patent: Nov. 16, 1999

[54] SEMICONDUCTOR STRUCTURES HAVING ADVANTAGEOUS HIGH-FREQUENCY CHARACTERISTICS AND PROCESSES FOR PRODUCING SUCH SEMICONDUCTOR STRUCTURES

[75] Inventors: Andreas Plettner, Feldafing; Karl Haberger, Planegg, both of Germany

[73] Assignee: Fraunhofer-Gesellschaft Zur Forderung Der Angewandten Forschung e.V., Germany

[21] Appl. No.: 08/809,222

[22] PCT Filed: Sep. 19, 1995

[86] PCT No.: PCT/EP95/03697

§ 371 Date: Jul. 29, 1997

§ 102(e) Date: Jul. 29, 1997

[87] PCT Pub. No.: WO96/09648

PCT Pub. Date: Mar. 28, 1996

[30] Foreign Application Priority Data

Sep. 19, 1994 [DE] Germany ............... 44 33 330

[51] Int. Cl.[6] .................................................. H01L 21/30
[52] U.S. Cl. .................... 438/455; 438/458; 438/459
[58] Field of Search .................... 438/406, 455, 438/458, 459

[56] References Cited

U.S. PATENT DOCUMENTS

| | | | |
|---|---|---|---|
| 4,091,408 | 5/1978 | Lee et al. | 357/56 |
| 4,826,787 | 5/1989 | Muto et al. | 437/208 |
| 5,260,233 | 11/1993 | Buti et al. | 437/195 |
| 5,286,670 | 2/1994 | Kang et al. | 437/61 |
| 5,355,022 | 10/1994 | Sugahara et al. | 257/768 |

FOREIGN PATENT DOCUMENTS

| | | |
|---|---|---|
| 0238066 | 3/1987 | European Pat. Off. . |
| 0635885 A1 | 7/1993 | European Pat. Off. . |
| 61-174661 | 8/1986 | Japan . |
| 4-3933 | 1/1992 | Japan . |

OTHER PUBLICATIONS

Wolf, S., Tauber R.N.; Silicon Processing for the VLSI Era vol. 1: Process Technology, Lattice Press, Sunset Beach, CA, p. 198, Jan. 1986.

Bursky, Dave, "Process Advancements Fuel IC Developments," Electronic Design, Cleveland, OH, Jan. 9, 1992, pp. 37–39, 42, 44, 48, 50, 52–54.

Hasima et al., "Silicon–on–Insulator Wafer Bonding–Wafer Thinning Technological Evaluations," *Japanese Journal of Applied Physics*, 28(8):1426–1443, Aug. 1989.

Thomas et al., "VLSI Multilevel Micro–Coaxial Interconnects for High Speed Devices," *IEDM*, pp. 55–58, 1990.

Roskos et al, "Propagation of Picosecond Electrical Pulses on a Silicon–Based Microstrip Line with Buried Cobalt Silicide Ground Plane," *Appl. Phys. Lett.*, 58:2604–2606, Mar. 15 1991.

Gardner et al., "Embedded Ground Planes Using Sidewall Insulators for High Frequency Interconnections in Integrated Circuits," *EEDM*, 93:251–254, 1993.

*Primary Examiner*—John F. Niebling
*Assistant Examiner*—Christopher Lattin
*Attorney, Agent, or Firm*—Seed and Berry LLP

[57] ABSTRACT

A process is disclosed for producing a semiconductor structure with a highly conductive buried layer with the following steps: an insulating layer is applied to a first surface of a first semiconductor substrate, an insulating layer is applied on a surface of a layer of highly conductive material which is physically separate from the first semiconductor substrate and then the insulation layers are bonded together.

32 Claims, 3 Drawing Sheets

☐ Si
▨ SiO$_2$
▨ Si-n$^{++}$
▨ Metal1

☐ Si
▧ SiO₂
▨ Si-n⁺⁺
▩ Metal1

SEMICONDUCTOR STRUCTURES HAVING ADVANTAGEOUS HIGH-FREQUENCY CHARACTERISTICS AND PROCESSES FOR PRODUCING SUCH SEMICONDUCTOR STRUCTURES

BACKGROUND OF THE INVENTION

The present invention relates to semiconductor structures having advantageous high-frequency characteristics and to processes for producing such semiconductor structures.

With increasing operating speeds of integrated circuits, nowadays up to 2 GHz can already be reached at the developmental stage, the influences to which an active component or a conductor path is subjected by neighboring active components or conductors pose more and more problems. Problems arise, in particular, from cross-talk effects created between neighboring signal lines and from propagation delays which can lead to synchronizing errors, signal delays, etc.

Every electric signal line influences its closest environment due to the electromagnetic field lines which are created by the signal line and propagate according to the prevailing potentials. Therefore, when an integrated circuit is designed, it is particularly difficult with respect to the connection lines between active elements to calculate the propagation delays to be expected, since these propagation delays are substantially determined by the capacitive and inductive characteristics of the lines which, in turn, are influenced by the active elements and signal lines arranged near said lines.

An approach to the solution of this problem is the provision of coaxial, i.e. shielded, lines inside the highly integrated circuit. Former solutions have suggested the manufacture of micro-coaxial conductor paths in the wiring planes of integrated circuits in which an inner conductor path is laid through an insulator by means of standard metallizing techniques as well as lithographic methods, and the insulator is sheathed by another metal layer, as is, for instance, described by M. E. Thomas, I. A. Saadat, S. Segigahma, IEEE-90, "VLSI Multilevel Micro-Coaxial Interconnects for High Speed Devices". The disadvantage of such a solution resides in the additionally required masking steps and thus in increased production costs.

Another suggestion deals with the manufacture of a so-called local "ground plane" which is achieved by means of a multi-layer metallizing method (cf. D. S. Gardner, Q. T. Vu, P. J. van Wijnen, T. J. Maloney, D. B. Fraser, IEDM 93 Proceedings, pp. 251–254, 1993).

The so-called "ground plane" is a metallic layer which extends at a small distance and in insulated fashion above the surface of the semiconductor and is grounded. This metal layer substantially determines the capacitive and inductive characteristics for the conductor paths positioned thereabove, and thus the characteristic impedance thereof, so that capacitive and inductive influences by active elements or conductor paths which are located in the respectively close vicinity are negligible.

SUMMARY OF THE INVENTION

It is the object of the present invention to provide semiconductor structures having improved characteristics at high frequencies, as well as processes for the easy production of such structures.

This object is achieved through the subject matters of the independent patent claims. Preferred developments are the subject matter of the subclaims.

According to one aspect of the present invention, there is generally indicated a semiconductor structure comprising a highly conductive buried layer which can be connected to a predetermined potential, preferably to ground. This highly conductive buried layer, which is to serve as a "ground plane", helps to improve the signal transmission characteristics in the semiconductor structure of integrated components or conductor paths. Especially at high frequencies, a considerable reduction of parasitary effects is achieved. The inductive and capacitive characteristics of integrated conductors or components are substantially determined by the highly conductive layer, so that each integrated element (conductor path or component) has about a constant characteristic impedance. This ensures improved synchronism between the signals passing through the individual components or conductor paths. Moreover, the highly conductive layer helps to reduce inductance by orders of magnitude, resulting in a decrease in the propagation time of the signals. And the characteristic impedance is also reduced to the same extent.

Another aspect of the present invention extends this idea to so-called 3D structures, i.e. structures in which a plurality of active layers are arranged one on top of the other. Because of the provision of highly conductive layers between the individual active layers, influences between components or conductor paths of different active layers are substantially suppressed.

The process for producing such a highly conductive buried layer according to patent claim 1 has the advantage that it can be carried out very easily, especially in process steps that are already fully developed technologically.

Further aspects of the present invention and preferred embodiments will become apparent from the patent claims and the description of the figures.

BRIEF DESCRIPTION OF THE DRAWINGS

Preferred embodiments of the present invention will now be explained in more detail with reference to the attached drawings. The drawings show in detail in FIG. 1 a simplified view for explaining the elementary steps of the process according to a first aspect of the present invention.

DETAILED DESCRIPTION OF THE DRAWINGS

One aspect of the present invention consists in providing processes with the aid of which a highly conductive "buried" layer can generally be obtained in an easy manner in a semiconductor structure.

Figure 1:
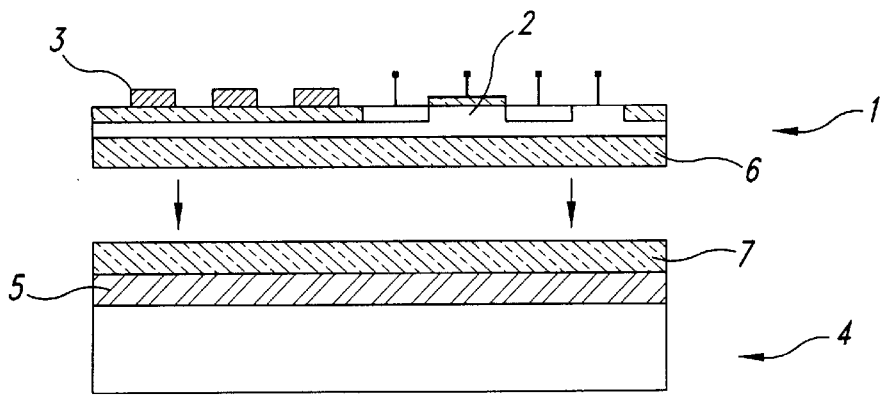

FIG. 1 illustrates the elementary steps of the process, which according to this partial aspect of the present invention serve to produce the highly conductive "buried" layer.

There is shown a first semiconductor structure 1 into or onto which active components and/or conductor paths are integrated or applied, i.e., either directly following the process to be described or already at the beginning of the process. In FIG. 1, the corresponding active elements 2 and conductor paths 3 are already drawn by way of example. Hence, in this embodiment, it is assumed that the active layer for the integration of the active elements and conductor paths is located in the semiconductor structure 1. The conductor paths are here preferably insulated by an oxide layer from the semiconductor structure.

A further semiconductor structure 4 is provided with a highly conductive layer 5. This layer may consist of metal in accordance with the "buried" layers already known in the prior art or, however, it may be a highly doped semiconductor layer. The highly conductive layer 5 can be applied in different ways to the semiconductor structure 4, for instance by ion implantation or metallizing processes, as will be described in more detail hereinbelow.

An insulation layer 6 and 7, respectively, is then applied to the back side of the semiconductor structure 1 and also to the highly conductive layer 5 which is provided on the second semiconductor structure 4. The insulation layer may, for example, be an oxidation layer, i.e. an $SiO_2$ layer, in the case of an Si semiconductor substrate.

After the insulation layers have been applied, the two semiconductor structures 1 and 4 are interconnected by way of the insulation layers, which can, for example, be achieved by adhesion or annealing, the known SFB (silicon fusion bonding) technique being preferably a possible technique in the case of silicon substrates.

In cases where components or conductor paths have not yet been integrated into the semiconductor structure 1, the substrate is removed (by grinding, etching, etc.) to such an extent, if necessary, that an active layer of suitable thickness is obtained into or onto which the components or conductor paths can then be integrated.

In the finished semiconductor structure, the highly conductive layer is preferably connected to a reference potential, preferably to ground.

The semiconductor layer in which the active elements are implemented is preferably made very thin, for instance in the range of from 0.1 to 2 $\mu$m. From a technological point of view, this can preferably be achieved by using a suitable rethinning method. The highly conductive layer has a thickness of less than 2 $\mu$m, preferably 0.5 $\mu$m. The thickness of the insulation layer is preferably 0, 1 to 2 $\mu$m.

Of course, the semiconductor structure 1 and 4 shown in FIG. 1 may be wafers which were produced in known methods, which have proved to be suited for mass production, and are thus available for commercial applications at reasonably low costs.

Figure 2:
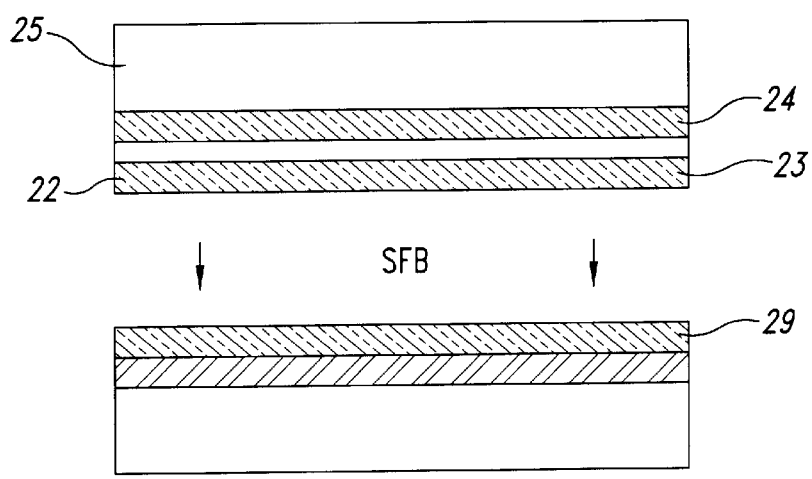
FIG. 2 a view for illustrating the steps of the process in a preferred embodiment based on the process of FIG. 1.

A preferred variant of the general embodiment of the process as described with reference to FIG. 1 is shown in FIG. 2.

FIG. 2 diagrammatically shows a commercially available BESOI (Back Etched Silicon On Insulator) wafer, which is designated by the general reference number 21. Instead of the BESOI wafer, a wafer produced by means of a SIMOX (Separation by Implanted Oxygen) technique may be employed. The BESOI wafer has additionally applied thereto an $SiO_2$ layer 22 by means of standard methods. The active layer of the BESOI wafer is silicon layer 23 of corresponding purity and planarity. Layer 24 is the insulation layer provided according to the general SOI technique, which in the present case preferably consists of an $SiO_2$ layer. The Si substrate 25 forms the base substrate of the wafer.

Spatially separated therefrom is another wafer 26 which has an n-doped Si substrate 27 onto or into which a highly conductive layer 28 is applied, the highly conductive layer 28 being an $n^{++}$-doped layer in the present case. The $n^{++}$-doped layer, in turn, has applied thereto an $SiO_2$ layer 29 which acts as an insulation layer. Subsequently, the two wafers 21 and 26 are preferably connected by employing the SFB (Silicon Fusion Bonding) technique, whereby a strong covalent bond is achieved between the oxide layers.

As a result of the above process, a highly conductive layer 28 has thus been "buried" in a simple manner underneath an insulation layer, which consists of layers 22 and 29, and thus underneath the active layer 23.

For a subsequent utilization of this "bonded" wafer, the active Si layer 23 must still be exposed. This may be done by making use of known methods, for instance, so-called selective etching methods which are based on the use of etchants which attack the Si substrate 25 and the $SiO_2$ layer 24 more strongly than the active layer 23. However, mechanical methods, such as suitable polishing methods, are also suited for removing layers 25 and 24.

As becomes apparent from FIG. 2, a preferred embodiment makes use of a commercially available BESOI wafer which with its "upper" side proper is "bonded" to another wafer carrying the highly conductive layer after the "upper" side has been oxidized in an oxidation process. Planarity problems can substantially be eliminated by using commercially available wafers.

Figure 3:
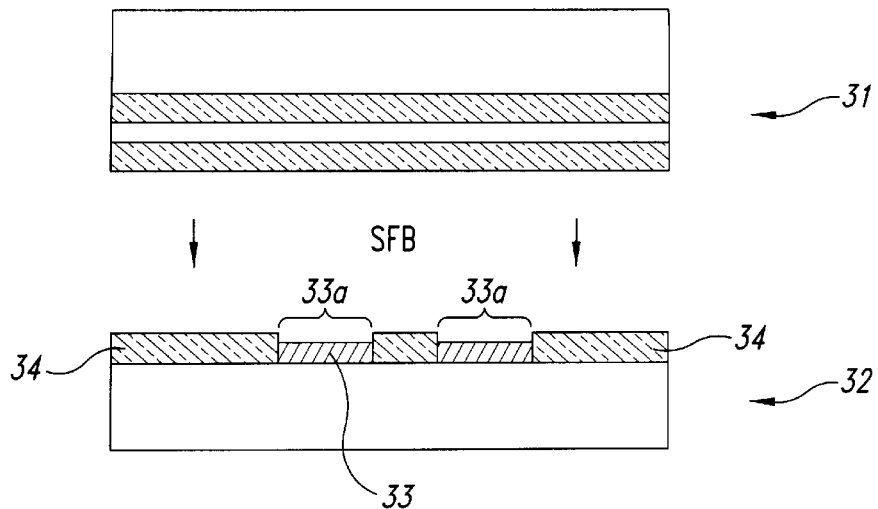
FIG. 3 a view for illustrating a further variant of the process based on the process as explained with reference to FIG. 1.

FIG. 3 shows another preferred embodiment in which two separate wafers 31 and 32 are illustrated again. Wafer 31 corresponds to wafer 21 of FIG. 2 so that the corresponding production steps need not be explained once again. Moreover, it should be clear that the use of a BESOI wafer just represents a preferred embodiment again, and that this wafer may also be formed by a general semiconductor structure with a corresponding insulation layer 6, as shown in FIG. 1.

In contrast to the illustration of FIG. 2, the further wafer 32 (here again preferably formed by an Si substrate) comprises a metal layer 33 as a conductive layer, wherein the layer is not applied continuously, but is provided in the shape of a grid (grid-shaped generally means a layer penetrated by openings). W, Ti or TiSi may preferably serve as metals.

The reason why the metal layer 33 is not of a continuous type is that the bonding process between the two wafers may be rendered more difficult when metal is used for the highly conductive layer, so that it may be of advantage, especially in the case of industrial production, to provide insulating material 34 in the openings of the preferably fine-meshed metal grid 33, with the insulating material 34 being oxidized, thereby permitting bonding with the corresponding insulation layer of the first wafer without any problems.

As far as the technical process is concerned, such a metal grid can be produced by providing the surface of the second wafer 32 with a fine network of trenches 33a having widths and depths in the $\mu$m range. Subsequently, the trenches 33a are, for example, filled with tungsten, whereby a coherent, fine-meshed and "buried" metal grid is formed which substantially terminates with the surface. The bonding process proper then takes place on the two silicon or $SiO_2$ regions of the two wafers. In general words, this technique prevents the bonding of heterogeneous materials. The network of trenches 33a can, for example, be produced by using lithographic methods. The filling with a metal may be performed by way of a metal coat which is then polished down to the semiconductor layer, so that the surface of the metal homogeneously ends with the surface of the semiconductor material. A CMP (Chemical Mechanical Polishing) method can, for instance, be used for the polishing process.

The application of the highly conductive layer 33 as a grid structure is, however, not limited to cases where metal is used as a highly conductive layer. Even if highly doped semiconductor layers are used therefor, the grid-like configuration may be advantageous for further processing.

Figure 4:
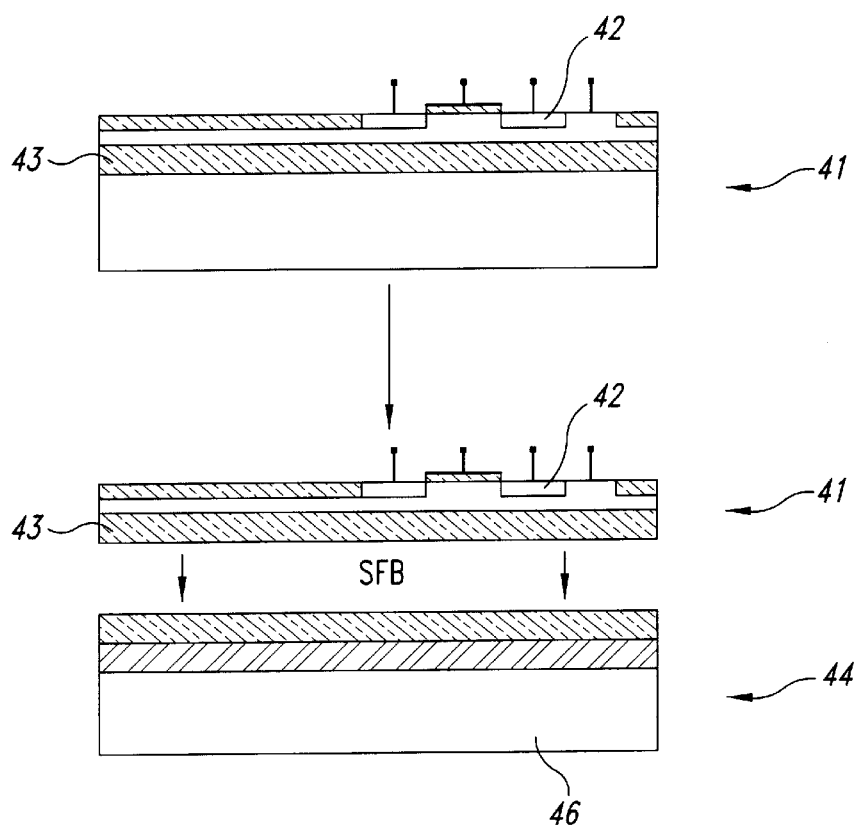
FIG. 4 a view for illustrating a further variant of the process based on the process as explained with reference to FIG. 1.

To further illustrate the many ways how the aspect of the invention as discussed in connection with FIGS. 1 to 3 can be implemented, FIG. 4 once again shows a wafer 41 produced by employing an SOI technique, which wafer 41 may particularly be again a BESOI or SIMOX wafer. As far as this wafer is concerned, an integrated structure 42 which may already be present at the beginning of the bonding process with the further wafer 44, or which, however, is supplied directly subsequent to the process of the invention by means of standard methods, is already drawn in by way of example. The illustrated wafer 41 no longer requires an oxiding step, since the wafer already includes an oxidation layer 43 down to which the Si substrate 46 is removed by employing corresponding methods, so that in the final analysis the thinner wafer 41 is bonded to the wafer 44.

It should once again be explicitly pointed out that although in the present case the wafer 44 is shown with a highly doped $n^{++}$ layer as the highly conductive layer, this highly conductive layer can of course be formed by highly doped polysilicon or metal, etc.

As already mentioned, tungsten is a suitable material in the case of a metal layer. However, a TiN layer or a combination of a W layer with a TiN layer is also conceivable, just like the deposition of silicides. In a combined W—TiN layer, the TiN layer may serve as a diffusion barrier against W diffusion into both oxide and bulk silicon. Moreover, it should be clear that the preferred SFB method need not be used for bonding, but that every suitable method may be employed, e.g. also adhesion methods. This is also applicable to the embodiments explained with reference to FIGS. 2 and 3. It should also be clear that in the embodiments as mentioned silicon has always been referred to just as an example of a semiconductor substrate and that any other semiconductor material known to the person skilled in the art can therefore be used just as well. Likewise, the indicated n-type doping may also be p-type doping, and the $SiO_2$ layers can be formed by other oxide layers or, generally, by insulation layers.

As already mentioned, the highly conductive layer can also be obtained by implanting, for instance, phosphorus or arsenic into the silicon wafer (or into another base substrate). The concentration of the implantation decreases from the surface of the substrate towards the interior of the substrate. However, due to subsequent oxidation, whereby an $SiO_2$ layer is preferably obtained, the implanted phosphorus or arsenic atoms (or other suitable atoms) are pushed forward before the oxidation front, so that an increase in the charge carrier concentration is directly observed underneath the finished oxidation layer. In other words, the demands made on the high-dose implantation of the foreign atoms need not be too high, since an increase in concentration takes place due to the subsequent oxidation process.

It should once again be pointed out in an explicit manner that the present invention relates not only to processes for producing a "ground plane" or highly conductive buried layer, but also to semiconductor structures themselves which include such highly conductive buried layers, namely independently of the mode of production in which these highly conductive buried layers are produced.

A special aspect of the present invention consists in the general indication of semiconductor structures in which a highly conductive layer is buried in a semiconductor structure by employing any desired methods, with the above-mentioned advantageous high-frequency characteristics being achieved through this buried layer.

In contrast to the "ground planes" known in the prior art, and according to one aspect of the present invention, such "ground planes" are not to be applied in isolated fashion above the surface of the semiconductor and thus above the active layer, but the highly conductive layer is to be integrated into the base substrate, so that a component manufacturer will still enjoy complete freedom of design, and troublesome lithographic steps which accompany an adjustment are not required on the other hand.

The general steps of a preferred process for such a semiconductor structure have been indicated with reference to FIG. 1. However, since the invention also relates to such semiconductor structures that are produced in other processes, it should once again be mentioned that the basic idea consists in providing an insulation layer (formed in FIG. 1 by the connected layers 6 and 7) underneath the active layer of a semiconductor substrate 1 and in providing underneath this insulation layer once again a highly conductive layer 5 which, in turn, may be applied to a semiconductor substrate 4. As for the thickness of the active semiconductor layer, the insulation layer and the highly conductive layer, the above comments continue to be applicable.

The semiconductor structure according to this aspect of the present invention may be of the type as has been described with reference to the above process, said structure being possibly not obtained by employing the corresponding processes, but by using different processes. For instance, the buried layers can also be produced by employing epitaxy methods and not, as described above, by joining two semiconductor substrates. The possibility of using an epitaxy method will be discussed in more detail further below.

Figure 6:
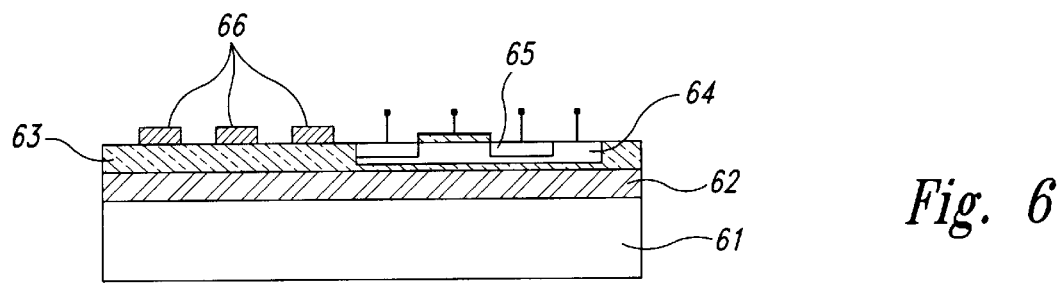
FIG. 6 a diagrammatic view of a preferred embodiment of a semiconductor structure of the invention.

FIG. 6 once again shows an embodiment of a semiconductor structure, illustrating a base substrate 61 of silicon with a highly conductive layer 62 and an insulation layer (e.g. $SiO_2$) 63 positioned above layer 62. An active semiconductor layer 64 into which components or conductor paths 65 are integrated is positioned above the insulation layer. Instead of, or in addition to, the conductor paths 65, conductor paths 66 can also be provided directly on the insulation layer 63.

The above-explained processes can, in particular, serve to produce so-called 3D semiconductor structures.

In these structures, a plurality of active layers are positioned one on top of the other in a semiconductor structure. According to the process of the invention, a highly conductive layer can be inserted between two respectively superimposed active layers; apart from the above-described general advantages, the highly conductive layer entails the additional advantage that interferences between the components or conductor paths of the different active layers are largely suppressed and that, in addition, identical capacitive and inductive characteristics are obtained for every active layer, i.e., the electrical behavior of a specific active layer is independent of the position thereof in the 3D structure.

It should once again be noted that the present invention encompasses such 3D structures with interposed highly conductive layers, preferably metal layers, also independently of the method of production in which these highly conductive layers are produced, i.e. the present invention also encompasses the 3D structure as such.

When a 3D structure is used, the individual conductive layers are preferably connected to the same reference potential, with different reference potentials for the individual highly conductive layers being possibly advantageous for specific applications.

If one of the inventive processes is used for producing the 3D structure, the interconnection of a plurality of BESOI wafers or SIMOX wafers in such a manner that they are arranged one on top of the other is especially recommended here. In every wafer on top of which another wafer is arranged, the active layer will be coated, after the integration process, with an oxide layer onto which the highly conductive layer will then be applied and thereupon the oxide layer for connection with the next wafer.

Figure 5:
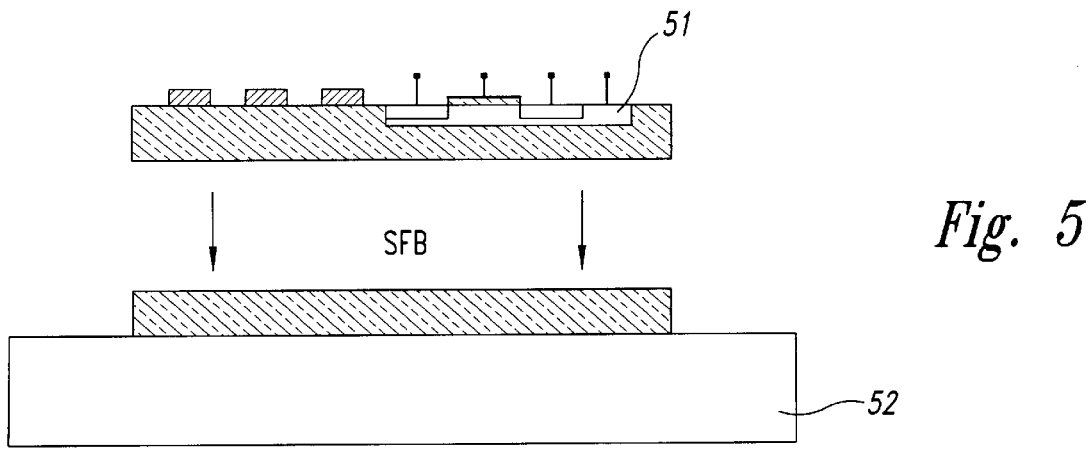
FIG. 5 a diagrammatic view for explaining a further aspect of the present invention.

An embodiment which refers to another aspect of the present invention is discussed with reference to FIG. 5. A wafer 51 which corresponds to wafer 1 of FIG. 1 and is here designed as a silicon wafer is directly bonded onto a previously oxidized metal plate 52. The metal plate may here be part of a waveguide or any other conductive base plate. Instead of metal plate 52, any other conductive base plates may be used. This approach of the present invention is based on the idea to position semiconductor structures and conductor paths, which are provided on semiconductor substrates, directly on a common base plate.

According to another aspect of the present invention, the active semiconductor layer, i.e. preferably the active thin silicon layer shown in FIGS. 2 to 5, for the active components can also be applied by employing an epitaxy method. A precondition therefor is that the grid constants of the base wafer and of the highly conductive film (of the highly conductive layer) and of the insulator and the useful layer of silicon correspond as much as possible to one another. A possible combination of these layers could, for instance, be Si, CoSi and CaF. For specific applications, this partial aspect of the present invention avoids the use of a second wafer.

Since in the process of the invention a highly conductive layer is provided in the semiconductor structure, this will facilitate regrinding or polishing processes in which a certain layer thickness should be observed as accurately as possible. The highly conductive layer can be used for measuring the layer thickness in a manner similar to the one described in P 44 20 862.6. However, an easier measurement of layers is possible not only during the production process due to the presence of the highly conductive layer, but layer thickness measurements on the finished semiconductor substrate are also facilitated thereby in subsequent process steps.

The highly conductive layer can be used for measuring the layer thickness of the useful layer proper. In this case, the highly conductive layer can serve as a mirror for electromagnetic radiation, especially visible and infrared light which in the known manner is used for layer thickness measurements by means of ellipsometry or spectral reflection. In cases where the buried layer consists of a ferromagnetic material or, generally, of a material of high permeability, it is also possible, by way of magnetic distance measurement, to make a statement on the useful layer thickness which still remains, and thus possibly on the layer thickness already achieved during the grinding/etching process in the course of the thinning process. More details are given in the above-mentioned patent application P 44 40 682.6.

Apart from the advantages for high-frequency components, such an integrated "ground plane" can also be advantageously used in other components. This is particularly true for CCDs for optical sensor arrays. These elements detect light by producing and separating electron-hole pairs in semiconductor substrates, wherein a displacement of the optically generated charge packets which is as free as possible from any loss is of importance to the readout mechanism. A "ground plane" can permit a spatially narrower structure due to the spatial concentration of the field lines on the individual structures, preferably MOS structures, and additionally accelerate the transfer process. Moreover, a metallic "ground plane" can increase efficiency by reflecting light, which then passes through the active volume of the individual CCD cells and the optical sensor twice. A suitable thickness of the intermediate oxide can simultaneously increase light coupling by destructive interference.

Moreover, the highly conductive layer or "ground plane" can serve shielding purposes with respect to interfering radiation or magnetic fields. A tungsten layer having a thickness of 2 $\mu$m can already achieve an efficient shield to $\alpha$-particles that cause "soft errors" in semiconductor memories. Moreover, a highly conductive layer or "ground plane" of ferroelectric material (e.g. nickel) or, generally, of a material having a high magnetic permeability can also be a shield with respect to magnetic fields.

We claim:

1. A method for producing a semiconductor structure including a highly conductive buried layer, the method comprising:

forming a first insulating layer on a first surface of a first semiconductor substrate;

forming a second insulating layer on a surface of a highly conductive layer wherein the highly conductive layer comprises a highly conductive material, wherein all portions of the highly conductive layer are electrically coupled to each other to share a common electrical potential, wherein the highly conductive layer is physically separated from the first semiconductor substrate, and wherein the highly conductive layer is formed over a second semiconductor substrate; and connecting the first and second insulating layers.

2. The method of claim 1 wherein at least the first semiconductor substrate is an Si substrate.

3. The method of claim 1 wherein the first and second insulating layers are produced by an oxidation process.

4. The method of claim 1 wherein at least one of the first and second insulating layers is an $SiO_2$ layer.

5. The method of claim 1 wherein the first and second insulating layers are connected by adhesion.

6. The method of claim 1 wherein the connecting step comprises annealing.

7. The method of claim 1 wherein the connecting step comprises a bonding method.

8. The method of claim 7 wherein the bonding step comprises silicon fusion bonding.

9. The method of claim 1 wherein the highly conductive layer comprises a highly doped semiconductor layer.

10. The method of claim 1 wherein the highly conductive layer comprises metal.

11. The method of claim 1 wherein the highly conductive layer comprises polysilicon.

12. The method of claim 10 wherein the highly conductive layer comprises a combination of metals.

13. The method of claim 1 wherein at least one of the first and second semiconductor substrates is part of a wafer.

14. The method of claim 1, further including polishing or etching the first semiconductor substrate to obtain an active layer which is suited for integration.

15. The method of claim 1 wherein the highly conductive layer is formed as a grid structure and the second insulating layer is also formed above the part of the second semiconductor substrate that is not covered by the grid structure.

16. The method of claim 15 wherein the grid structure is produced by photolithographic methods producing a trench structure in the second semiconductor substrate wherein the photolithographic methods subsequently fill in the trench structure with metal.

17. The method of claim 16 wherein the metal is formed as a film and is subsequently removed by a polishing process down to the second semiconductor substrate.

18. The method of claim 1 wherein the highly conductive layer comprises metal wherein the metal is formed as a film and is subsequently removed in a polishing process down to the second semiconductor substrate.

19. The method of claim 1 wherein a BESOI or SIMOX wafer is used at least for the first semiconductor substrate.

20. The method of claim 19 wherein the BESOI wafer comprises an active layer and wherein an oxide layer is formed over the active layer as an insulation layer.

21. The method of claim 19 wherein the BESOI wafer has a back side and adjoining oxide layer and wherein the back side of the BESOI wafer and the adjoining oxide layer are removed to expose the future active Si layer.

22. The method of claim 21 wherein selective etching methods are used to remove the back side of the BESOI wafer and the adjoining oxide layer.

23. The method of claim 21 wherein polishing methods are used to remove the back side of the BESOI wafer and the adjoining oxide layer.

24. The method of claim 19 wherein the base substrate of the BESOI or SIMOX wafer is removed down to the oxide layer and the exposed oxide layer is used for connecting purposes.

25. The method of claim 1 wherein the steps of claim 1 are repeated to produce 3D structures.

26. The method of claim 25 wherein a plurality of BESOI or SIMOX wafers are connected in superimposed fashion and wherein the BESOI or SIMOX wafers have been rethinned.

27. The method of claim 26 wherein after integration of the corresponding conductor paths or active components the active layers of the BESOI or SIMOX wafers are covered with an oxide layer, a highly conductive layer positioned thereabove and once again with an oxide layer, the latter being used for connection with the wafer located thereabove.

28. The method of claim 1 wherein the highly conductive layer is used as a thickness standard for layer thickness measurements.

29. The method of claim 1 wherein the semiconductor structure produced is a micro-waveguide.

30. The method of claim 10 wherein the conductive layer comprises one of the following:

W, Ti or TiSi.

31. The method of claim 12 wherein the combination of metals comprises a W layer and a TiN and wherein the TiN serves as a diffusion barrier.

32. The method of claim 14 wherein processing includes one of the following:

polishing or etching.

* * * * *